(12) United States Patent
Yu

(10) Patent No.: US 11,201,282 B2
(45) Date of Patent: Dec. 14, 2021

(54) MAGNETIC MEMORY STRUCTURE AND DEVICE

(71) Applicant: Yangtze Memory Technologies Co., Ltd., Wuhan (CN)

(72) Inventor: Dan Yu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/893,877

(22) Filed: Jun. 5, 2020

(65) Prior Publication Data

US 2021/0257545 A1    Aug. 19, 2021

Related U.S. Application Data

(63) Continuation of application No. PCT/CN2020/075794, filed on Feb. 19, 2020.

(51) Int. Cl.
| | |
|---|---|
| H01L 43/08 | (2006.01) |
| G11C 11/16 | (2006.01) |
| H01L 43/10 | (2006.01) |
| H01L 43/02 | (2006.01) |
| H01L 27/22 | (2006.01) |
| H01L 43/12 | (2006.01) |

(52) U.S. Cl.
CPC ............ *H01L 43/08* (2013.01); *G11C 11/161* (2013.01); *G11C 11/1675* (2013.01); *H01L 27/228* (2013.01); *H01L 43/02* (2013.01); *H01L 43/10* (2013.01); *H01L 43/12* (2013.01)

(58) Field of Classification Search
CPC .... G11C 11/1675; G11C 11/161; G11C 11/16
See application file for complete search history.

(56) References Cited

U.S. PATENT DOCUMENTS

| | | | |
|---|---|---|---|
| 2011/0069537 A1 | 3/2011 | Gao et al. | |
| 2011/0194341 A1* | 8/2011 | Gaidis | H01L 27/224 365/171 |
| 2014/0169088 A1* | 6/2014 | Buhrman | H01F 10/3286 365/158 |
| 2019/0148046 A1* | 5/2019 | Suzuki | H01L 43/08 327/552 |

FOREIGN PATENT DOCUMENTS

| | | |
|---|---|---|
| CN | 1747060 A | 3/2006 |
| CN | 101452990 A | 6/2009 |

(Continued)

*Primary Examiner* — Tan T. Nguyen
(74) *Attorney, Agent, or Firm* — Anova Law Group, PLLC

(57) ABSTRACT

Magnetic memory devices and methods are provided. In one aspect, a memory device may comprise a control circuitry and at least one array of memory structures. Each memory structure may comprise a metal layer and a first magnetic tunnel junction (MTJ) disposed on the metal layer. The metal layer may include a first region and a second region. Electrical resistivity of at least a first part of the first region is different from electrical resistivity of the second region. The first magnetic tunnel junction (MTJ) may comprise a first free layer adjacent to the metal layer, a first barrier layer adjacent to the first free layer, and a first reference layer adjacent to the first barrier layer. The first free layer is in contact with the first region of the metal layer.

19 Claims, 8 Drawing Sheets

(56) References Cited

FOREIGN PATENT DOCUMENTS

| | | |
|---|---|---|
| CN | 102468425 A | 5/2012 |
| CN | 102479919 A | 5/2012 |
| CN | 105308683 A | 2/2016 |
| CN | 105895799 A | 8/2016 |
| CN | 106025063 A | 10/2016 |
| CN | 108292704 A | 7/2018 |
| CN | 109873076 A | 6/2019 |
| CN | 110197682 A | 9/2019 |
| CN | 110660899 A | 1/2020 |
| EP | 3319134 A1 | 5/2018 |

\* cited by examiner

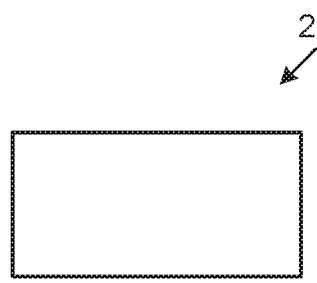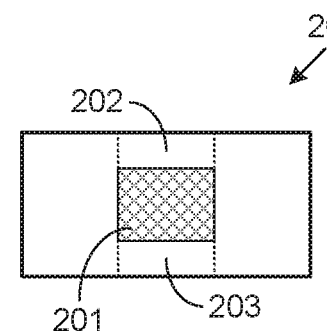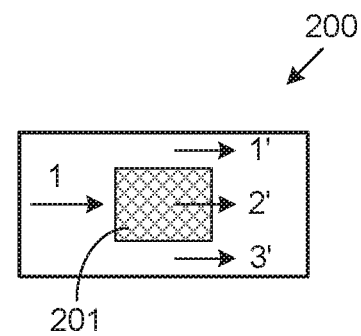
FIG. 2A  FIG. 2B  FIG. 2C
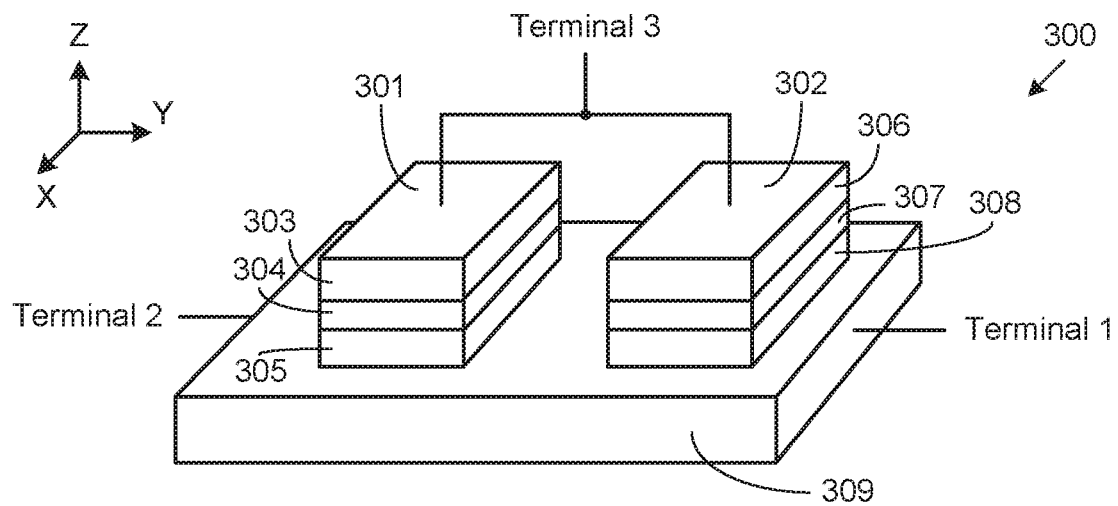
FIG. 3A
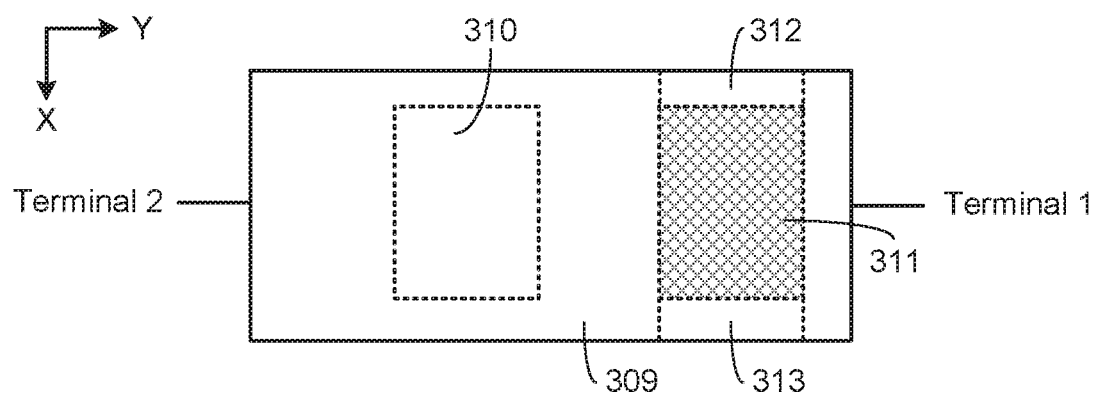
FIG. 3B

MAGNETIC MEMORY STRUCTURE AND DEVICE

CROSS-REFERENCE TO RELATED APPLICATION

This application is a continuation of International Application No. PCT/CN2020/075794, filed on Feb. 19, 2020, the entire content of which is incorporated herein by reference.

FIELD OF THE TECHNOLOGY

This application relates to the field of memory technology and, specifically, to methods and apparatus of spin-orbit torque magnetoresistive random access memory (SOT-MRAM).

BACKGROUND OF THE DISCLOSURE

Spin-orbit torque magnetoresistive random access memory (SOT-MRAM) is a type of nonvolatile memory with low write power, fast read speed, zero leakage, and compatibility with the CMOS process. SOT-MRAM comprises a magnetic tunnel junction (MTJ) disposed on a heavy metal layer. The MTJ includes a reference layer, a tunnel barrier layer, and a free layer, where the tunnel barrier layer is sandwiched by the reference and free layers. The tunnel barrier layer consists of a thin insulating layer. The reference and free layers are ferromagnetic. The magnetization direction of the reference layer is fixed, while the magnetization direction of the free layer is switchable.

The tunnel barrier layer of the MTJ is designed such that an electric current may flow across it due to quantum tunneling. The tunnel magnetoresistance effort is used for the read operation of a SOT-MRAM device. Two distinct resistance levels of the MTJ may exist. When the magnetization states of the reference layer and the free layer are parallel, the resistance is relatively low. When the magnetization states of the reference and free layers are anti-parallel, the resistance is relatively high. The two distinct resistance levels allow data to be stored. For example, a relatively low resistance level may correspond to data "1" and a relatively high resistance level may correspond to data "0".

The write operation of a SOT-MRAM device is performed by changing the direction of magnetization of the free layer. As a result of spin-Hall effect (SHE), an electric current induces spin accumulation at the lateral boundaries of a conductor which carries the current. At a SOT-MRAM device, the free layer is disposed on a heavy metal layer. When an electric current flows along the heavy metal layer, a spin current in the transverse direction is created. Then, a torque or spin-orbit torque (SOT) is induced and the SOT is exerted on the magnetization in the free layer based on SHE and/or Rashba effect. As such, the direction of magnetization of the free layer may be switched, which means information may be written into the free layer by injecting a current through the heavy metal layer. A regular SOT-MRAM is a single-level memory device. For example, it is used to store data "0" or "1" only, which is not a multilevel memory device and less practical for high-density memory applications.

The disclosed methods and systems are directed to solve one or more problems set forth above and other problems.

SUMMARY

In one aspect of the present disclosure, a memory device may comprise a control circuitry and at least one array of memory structures. The control circuitry may control the memory device. Each memory structure may comprise a metal layer and a first magnetic tunnel junction (MTJ) disposed on the metal layer. The metal layer may include a first region and a second region. Electrical resistivity of at least a first part of the first region is different from electrical resistivity of the second region. The first magnetic tunnel junction (MTJ) may comprise a first free layer adjacent to the metal layer, a first barrier layer adjacent to the first free layer, and a first reference layer adjacent to the first barrier layer. The first free layer is in contact with the first region of the metal layer. A direction of magnetization of the first free layer is switchable between a first direction and a second direction under an influence of an electric current flowing along the metal layer. The first barrier layer comprises an electrically insulating material. The first free layer is disposed between the metal layer and the first barrier layer. A direction of magnetization of the first reference layer remains along the first direction or the second direction. The first barrier layer is disposed between the first free layer and the first reference layer.

In another aspect of the present disclosure, a method may comprise depositing a metal layer on a substrate; performing an ion implantation process; depositing a free layer; depositing a barrier layer; depositing a reference layer; forming multiple first magnetic tunnel junctions (MTJs) and multiple second magnetic tunnel junctions (MTJs) on the metal layer; and forming an array of memory structures. The metal layer may comprise multiple first contact regions and multiple second contact regions. Each first contact region may be adjacent to one of the second contact regions. At least a part of each first contact region may be processed by the ion implantation process. Each first magnetic tunnel junction (MTJ) may be adjacent to one of the first contact regions. Each second magnetic tunnel junction (MTJ) may be adjacent to one of the second contact regions. Each memory structure may comprise one of the first magnetic tunnel junctions (MTJs) and one of the second magnetic tunnel junctions (MTJs).

In another aspect of the present disclosure, an electronic device may comprise a microprocessor, a memory device, a controller, an output module, and an input module. The controller may control the memory device. The memory device may comprise at least one array of memory structures. Each memory structure may comprise at least a first magnetic tunnel junction (MTJ) disposed on a metal layer. The metal layer may include a first region and a second region. Electrical resistivity of at least a first part of the first region is different from electrical resistivity of the second region. The first magnetic tunnel junction (MTJ) may comprise a first free layer, a first barrier layer, and a first reference layer. The first free layer may be in contact with the first contact region of the metal layer. The first free layer may be disposed between the metal layer and the first barrier layer. The first barrier layer may include an electrically insulating material and be disposed between the first free layer and the first reference layer. A direction of magnetization of the first free layer may be switchable between a first direction and a second direction under an influence of an electric current that flows along the metal layer. A direction of magnetization of the first reference layer may remain along the first direction or the second direction.

Other aspects of the present disclosure can be understood by those skilled in the art in light of the description, the claims, and the drawings of the present disclosure.

BRIEF DESCRIPTION OF THE DRAWINGS

FIGS. 2A, 2B, and 2C illustrate schematically the effect of ion implantation according to embodiments of the present disclosure;

FIGS. 3A and 3B illustrate schematic structural diagrams of a multilevel SOT-MRAM structure according to another embodiment of the present disclosure;

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all the embodiments of the present disclosure. Features in various embodiments may be exchanged and/or combined. Other embodiments obtained by a person skilled in the art based on the embodiments of the present disclosure without creative efforts shall fall within the protection scope of the present disclosure.

Figure 1A:
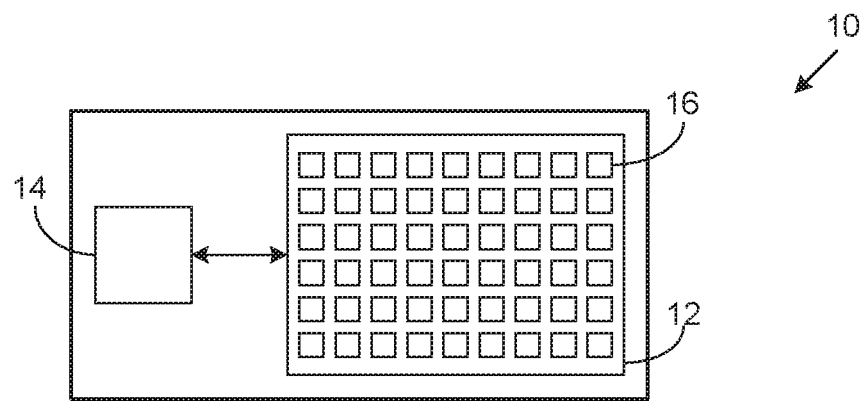
FIG. 1A illustrates a schematic block diagram of a memory device according to embodiments of the present disclosure.

FIG. 1A is a schematic block diagram illustrating a memory device 10, consistent with embodiments of the present disclosure. The device 10 may include a memory region 12 and a control circuitry 14. The memory region 12 may comprise an array of memory structures 16. The memory device 10 may perform operations including a read operation, a write operation, and/or an erase operation under the control of the control circuitry 14. The memory region may comprise more than one array of the memory structures 16 (e.g., memory cells). In some embodiments, the device 10 may include multiple memory regions, where each memory region may comprise one or more arrays of the memory structures 16. The memory structures will be discussed in detail below. Optionally, the device 10 may include different types of memories, such as magnetic memories to be discussed, DRAM, SRAM, and flash, etc.

The control circuitry 14 may comprise command/address/clock input circuitry, decoders, voltage and timing generators, input/output circuitry, etc. In some embodiments, the control circuitry 14 may be provided on the same die as the memory region 12. In some other embodiments, the control circuitry 14 may be provided on a separate die. In some embodiments, the control circuitry 14 may include a microcontroller, special purpose logic circuitry, or another suitable processor. In some other embodiments, the control circuitry 14 may include embedded memory for storing data and fetching data. Alternatively, the memory device 10 may not include the control circuitry 14, and may instead rely upon external control. For example, an external control may be provided by a host electronic device or by a processor or controller that is separate from the memory device 10.

Figure 1B:
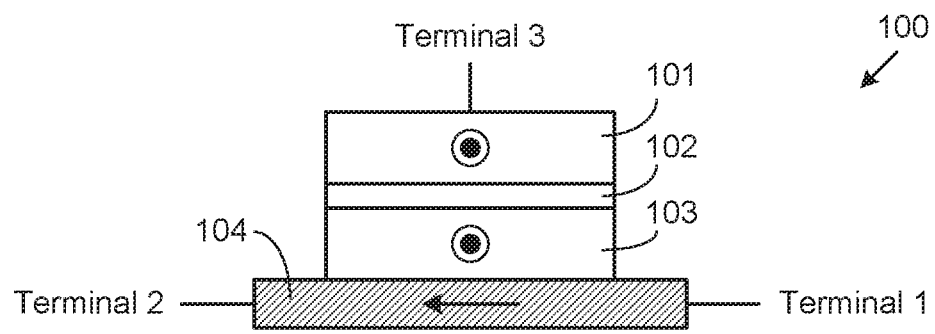
FIGS. 1B and 1C illustrate schematic structural diagrams of a spin-orbit torque magnetoresistive random access memory (SOT-MRAM) structure.
Figure 1C:
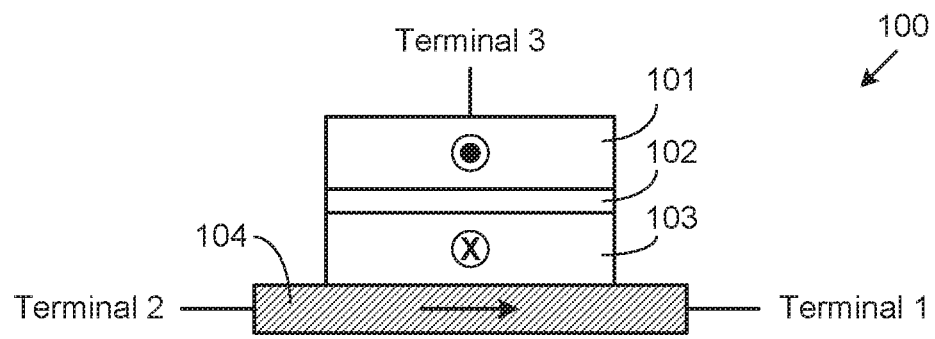

The memory structure 16 may be a memory structure based on spin-orbit torque magnetoresistive random access memory (SOT-MRAM). FIGS. 1B and 1C illustrate schematic structural diagrams of a single-level SOT-MRAM structure 100. FIGS. 1B and 1C are cross-sectional views of the structure 100 that may include a reference layer 101, a barrier layer 102, a free layer 103, and a metal layer 104. Terminals 1, 2, and 3 may be electrically coupled to two ends of the metal layer 104 and the reference layer 101, respectively. The reference layer 101 may comprise a ferromagnetic material. Its magnetization direction may be stable due to a high energy barrier and fixed during the operation of the structure 100. The free layer 103 may also comprise a ferromagnetic material. Its magnetization direction may be stable due to a high energy barrier, too. However, in contrast to the reference layer 101, the magnetization direction of the free layer 103 may be switched under certain external influence during the operation. The change of magnetization direction of the free layer 103 may be used to store information. The barrier layer 102 may comprise an electrically insulating material which is non-magnetic or weakly magnetic. The reference layer 101, the barrier 102, and the free layer 103 may form a magnetic tunnel junction (MTJ) and the electrical resistance of the MTJ may be used to read the stored information.

The metal layer 104 may be made of a non-magnetic heavy metal. A heavy metal creates relatively strong spin-orbit coupling. In some embodiments, the metal layer 104 may include a heavy metal with a positive spin Hall angle such as platinum (Pt), palladium (Pd), or gold (Au). In some embodiments, the metal layer 104 may include a heavy metal with a negative spin Hall angle such as tungsten (W), tantalum (Ta), or hafnium (Hf). The spin Hall angle describes the efficiency of the conversion of charge current density into spin accumulation density. In the following descriptions, a heavy metal with a negative spin Hall angle such as W or Ta is used to illustrate exemplary embodiments.

The electrical resistance of the MTJ may be determined by the magnetization of the reference layer 101 and the free layer 103. When the magnetization states of the reference layer 101 and the free layer 103 are parallel, the resistance is relatively low. When the magnetization states are anti-parallel, the resistance is relatively high. As the magnetization direction of the reference layer 101 is fixed, the change of the magnetization direction of the free layer 103 may be utilized to store information. The magnetization state of the free layer 103 may be switched using an electric current applied to the metal layer 104. The electric current may function as the write current of the structure 100.

Referring to FIG. 1B, assuming that magnetization state of the reference layer 101 is arranged along a direction out of the page. When an electric current flows from the terminal 1 to the terminal 2, a corresponding spin current in the transverse direction is created at the boundaries of the metal layer 104. As the free layer 103 is in contact with the metal layer 104, its magnetization state may be altered by the induced spin-orbit torque (SOT). As such, the magnetization state of the free layer 103 may be switched to a direction out of the page, if the original direction is into the page. Hence, the magnetization states of the reference layer 101 and the free layer 103 may become parallel. When the electrical resistance of the MTJ is measured via the terminals 1 and 3 or 2 and 3, the resistance level is relatively low due to the parallel magnetization states.

When the current changes direction, such as flowing from the terminal 2 to the terminal 1 as shown in FIG. 1C, the spin current changes at the boundaries of the metal layer 104. Under the influence of the SOT, the magnetization state of the free layer 103 may be switched to a direction into the page. As a result, the magnetization states of the reference layer 101 and the free layer 103 may become anti-parallel. When the electrical resistance of the MTJ is measured via the terminals 1 and 3 or 2 and 3, it changes from the relatively low resistance to relatively high resistance.

Thus, the write process of the SOT-MRAM device 100 may be performed by applying a current to the metal layer 104 and the read process may be performed by measuring electrical resistance of the MTJ.

FIGS. 2A, 2B, and 2C illustrate the effect of ion implantation in top views graphically. A metal layer 200 as shown in FIG. 2A is processed by an ion implantation procedure. Ions of a non-metal material may be accelerated into or implanted in the metal layer 200. Further, the metal layer 200 may go through a heat treatment process or annealing process. An ion implantation region 201 may be formed as shown in FIG. 2B. Because non-metal elements are introduced in the region 201, the electrical resistivity of the region 201 may become larger than other regions of the metal layer 200.

As shown in FIG. 2B, three regions 201, 202, and 203 are created after the ion implantation process, which are configured along a direction perpendicular to a path of an electric current, assuming the electric current flows between the left and right sides of the metal layer 200. Among the regions, electrical resistivity of the region 201 is larger than electrical resistivity of the regions 202 and 203 respectively due to the ion implantation.

As a segment of the metal layer 200 is divided into the regions 201, 202, and 203 along the direction perpendicular to the path of electric current, the three regions are electrically connected in parallel. When an electric current 1 is applied to the metal layer 200, as shown in FIG. 2C, the current may be split into three sub-currents 1', 2', and 3' going through the regions 202, 201, and 203, respectively. Because electrical resistivity of the region 201 is larger than that of the regions 202 and 203 due to effect of the ion implantation, electric current density in the region 201 may be smaller than electric current density in regions 202 and 203. Therefore, the ion implantation process may increase electrical resistivity of the region 201, which in turn may reduce the electric current density there. While the electric current density may be reduced in an ion implantation region, such as the region 201, the electric current density outside the ion implantation region, such as the regions 202 and 203, may be increased if the electric current 1 remains unchanged.

FIGS. 3A and 3B show schematic structural diagrams of an exemplary multilevel SOT-MRAM structure 300, consistent with embodiments of the present disclosure. FIG. 3A is a perspective view of the structure 300 and FIG. 3B is a graphical illustration in a top view of the structure 300. As shown in FIGS. 3A and 3B, the structure 300 may comprise MTJs 301 and 302 electrically connected in parallel. The MTJ 301 may include a reference layer 303, a barrier layer 304 adjacent to the reference layer 303, and a free layer 305 adjacent to the barrier layer 304. The MTJ 302 may include a reference layer 306, a barrier layer 307 adjacent to the reference layer 306, and a free layer 308 adjacent to the barrier layer 307. The MTJs 301 and 302 may be disposed on a metal layer 309 and spaced apart by a predetermined distance. At the MTJ 301, the barrier layer 304 may be sandwiched by the reference layer 303 and the free layer 305. The free layer 305 may be in contact with the metal layer 309 and sandwiched by the barrier layer 304 and the metal layer 309. At the MTJ 302, the barrier layer 307 may be sandwiched by the reference layer 306 and the free layer 308. The free layer 308 may be in contact with the metal layer 309 and sandwiched by the barrier layer 307 and the metal layer 309. Terminals 1 and 2 may be electrically coupled with two ends of the metal layer 309, respectively. A terminal 3 and the reference layers 303 and 306 may be electrically coupled. The terminal 1 or 2 may be electrically coupled to a bit line. The terminal 3 may be electrically coupled to a word line.

The reference layers 303 and 306 may comprise a ferromagnetic material such as $Co_2Fe_6B_2$. Magnetization directions of the reference layers 303 and 306 may be stable due to a high energy barrier and fixed during the operation of the structure 300. The free layer 305 may be arranged thinner than the reference layer 303 and comprise a ferromagnetic material such as $Co_2Fe_6B_2$. The free layer 308 may be arranged thinner than the reference layer 306 and comprise a ferromagnetic material such as $Co_2Fe_6B_2$. Magnetization directions of the free layer 305 and 308 may be stable due to a high energy barrier, too. However, in contrast to the reference layers, magnetization directions of the free layers 305 and 308 may be individually switchable between two directions under certain external influence during the operation of the structure 300. The change of magnetization direction of the free layers 305 and 308 may be used to store multilevel information. The barrier layers 304 and 307 may each work as the tunnel barrier layer. They may comprise an electrically insulating material which is non-magnetic or weakly magnetic. For instance, the barrier layers 304 and 307 may comprise MgO. The metal layer 309 may be made of a non-magnetic heavy metal.

Electrical resistance of the MTJs 301 and 302 may be used to read information stored at the structure 300. Assuming that the MTJs 301 and 302 comprise a same structure and same materials. For example, the barrier layers 304 and 307 may include a same material and same thickness. One of the MTJs, such as the MTJ 301, may be used as an example in discussions below, which also apply to the MTJ 302. The electrical resistance of the MTJ 301 may be determined by the magnetization orientation of the reference layer 303 and the free layer 305. When the magnetization states of the reference layer 303 and the free layer 305 are parallel, the electrical resistance of the MTJ 301 is relatively low. When the magnetization states of the reference layer 303 and the free layer 305 are anti-parallel, the electrical resistance of the MTJ 301 is relatively high. As the magnetization direction of the reference layer 303 is fixed, the change of the magnetization direction of the free layer 305 may be utilized to store information. The magnetization state of the free layer 305 may be switched using an electric current applied to the metal layer 309 via the terminals 1 and 2. The electric current may function as the write current of the structure 300.

Assuming that magnetization states of the reference layers 303 and 306 are arranged along the positive direction of the X axis. As aforementioned, when an electric current flows from the terminal 1 to the terminal 2, a corresponding spin current in the transverse direction may be created at the boundaries of the metal layer 309. As the free layers 305 and 308 are in contact with the metal layer 309, their magnetization states may be switched by the SOT. As such, the magnetization states of the free layers 305 and 308 may be switched to the positive direction of the X-axis. Then, the magnetization states of the reference layer 303 and the free layer 305 may become parallel. Similarly, the magnetization states of the reference layer 306 and the free layer 308 may become parallel, too. When the electrical resistance of the MTJs 301 and 302 is measured via the terminals 1 and 3 or 2 and 3, the electrical resistance level may be relatively low due to the parallel magnetization states.

When the electric current changes direction, such as flowing from the terminal 2 to the terminal 1, the spin current changes at the boundaries of the metal layer 309. Under the influence of the SOT, the magnetization states of the free layers 305 and 308 may be switched to the negative direction of the X axis. Resultantly, the magnetization states of the reference layer 303 and the free layer 305 may become anti-parallel. Similarly, the magnetization states of the reference layer 306 and the free layer 308 may become anti-parallel as well. When electrical resistance of the MTJs 301 and 302 is measure via the terminals 1 and 3 or 2 and 3, it may change from the relatively low resistance to relatively high resistance.

Accordingly, the write process of the structure 300 may be performed by applying an electric current to the metal layer 309 and the read process may be performed by measuring electrical resistance of the MTJs 301 and 302 which are parallel connected electrically.

The above description of the structure 300 may reflect the operation of a single-level SOT-MRAM device, where only data such as "1" or "0" may be stored and read.

FIG. 3B is a graphic illustration of the SOT-MRAM structure 300 and represents a top view, with the MTJs 301 and 302 omitted for simplicity reasons. As aforementioned, the free layers 305 and 308 are in contact with the metal layer 309. Assuming that the free layers 305 and 308 contact surfaces of contact regions 310 and 311 of the metal layer 309, respectively. Rectangles in dotted lines illustrate the contact regions 310 and 311, as shown in FIG. 3B. The shape of the contact regions 310 and 311 may match and thus reflect the shape of the free layers 305 and 308 or the shape of the MTJs 301 and 302. In some embodiments, the free layers 305 and 308 or the MTJs 301 and 302 may have a rectangular shape, a square shape, or a circular shape. In some other embodiments, the free layers 305 and 308 or the MTJs 301 and 302 may have an irregular shape. In discussions below, rectangular shapes are used. Further, ions may be implanted in one of the contact regions, such as the contact region 311. Ions of non-metal materials, such as silicon, phosphorus, or nitrogen, may be used for implantation. An annealing step may follow the implantation process.

After the ion implantation, electrical resistivity of the contact region 311 may increase. The electrical resistivity of the contact region 311 may become larger than electrical resistivity of the rest of the metal layer 309, including the contact region 310 and regions 312 and 313. As shown in FIG. 3B, a segment of the metal layer 309 may be divided into the regions 312, 311, and 313, which are arranged along the X axis, i.e., a direction perpendicular to a path of the electric current. As the regions 312, 311, and 313 are electrically coupled in parallel, an electric current applied to the metal layer 309 may be split into three sub-currents. Due to the larger electrical resistivity in the region 311 than in the regions 312 and 313, the electric current density in the region 310 may be larger than the electric current density in the region 311. A larger electric current density may induce a larger spin current density that may be injected into the free layer 305.

In some embodiments, the MTJs 301 and 302 may comprise a same structure and same material. Hence, the free layers 305 and 308 may have a same threshold of the electric current density for switching the magnetization orientation. Because the electric current density in the region 310 is larger than in the region 311, when a write current is injected to the metal layer 309, there exist three scenarios. When the write current is arranged such that electric current densities in both the regions 310 and 311 are larger than the threshold of the electric current density, magnetization of free layers 305 and 308 may be switched simultaneously. When the electric current density in the region 310 is larger than the threshold, while the electric current density in the region 311 is below the threshold, magnetization of only one free layer, the free layers 305, may be switched. When the electric current density in the region 310 is below the threshold, magnetization of neither of the free layers 305 and 308 may be switched.

Therefore, the structure 300 may provide four distinguishable electrical resistance states, which may represent four memory states or four memory levels. The four electrical resistance states may correspond to electrical resistance R1, R2, R3, and R4 of the MTJs 301 and 302, where it is arranged that R1<R2<R3<R4.

The first electrical resistance state with electrical resistance R1 may be written using an electric current that produces an electric current density larger than the threshold in the region 311. As the free layers 305 and 308 have the same threshold and the electric current density in the region 310 is larger than in the region 311, the electric current density is larger than the threshold in both of regions 310 and 311 simultaneously. As such, magnetization of free layers 305 and 308 may be switched together. Both of the MTJs 301 and 302 may have the parallel magnetization states for the reference and free layers. The electrical resistance of the MTJs 301 and 302 is the smallest.

The second electrical resistance state with electrical resistance R2 may be written using two electric currents sequentially. A first electric current produces an electric current density larger than the threshold in both the regions 310 and 311. A second electric current produces an electric current density larger than the threshold in the region 310 only. The first electric current may be applied to make anti-parallel magnetization states for the reference and free layers of both MTJs 301 and 302. As the second electric current can only switch magnetization state of the free layer 305, it may be utilized to make parallel magnetization states for the reference and free layers of the MTJ 301. The electrical resistance R2 of the MTJs 301 and 302 is the second smallest.

The third electrical resistance state with electrical resistance R3 may be written using two sequential electric currents as well. A first electric current may produce an electric current density larger than the threshold in both the regions 310 and 311. A second electric current may produce an electric current density larger than the threshold in the region 310 only. The first electric current is used to make parallel magnetization states for the reference and free layers of both the MTJs 301 and 302. As the second electric current can only switch magnetization state of the free layer 305, it may be used to make anti-parallel magnetization states for the reference and free layers of the MTJ 301. The electrical resistance R3 of the MTJs 301 and 302 is the second largest.

The fourth electrical resistance state with electrical resistance R4 may be written using an electric current that may produce an electric current density larger than the threshold in both the regions 310 and 311. Both of the MTJs 301 and 302 may be switched to the anti-parallel magnetization states for the reference and free layers. The electrical resistance R4 of the MTJs 301 and 302 is the largest.

Figure 3C:
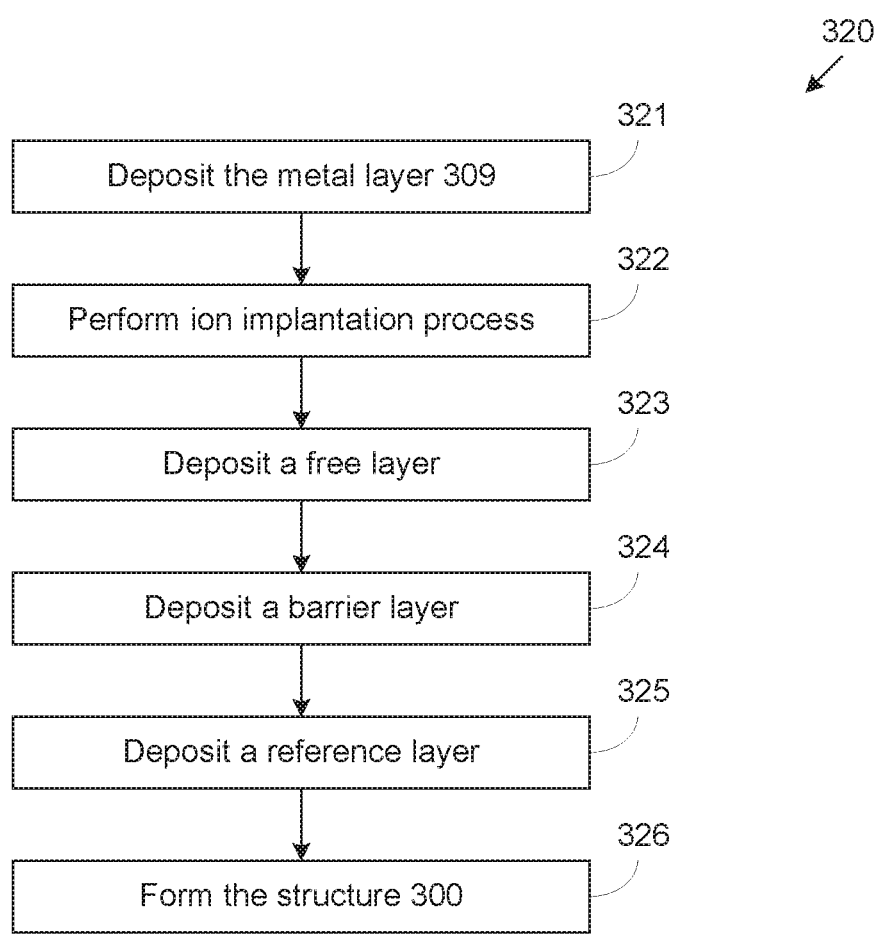
FIG. 3C illustrates a schematic flow chart of fabrication of a multilevel SOT-MRAM structure according to embodiments of the present disclosure.

FIG. 3C is a flow chart 320 illustrating a schematic fabrication process of the structure 300, consistent with embodiments of the present disclosure. The fabrication process 320 is applicable to the structure 300 as well as batch fabrication of arrays of the structures 300. At step 321, a layer of a heavy metal may be deposited on a substrate. At step 322, an ion implantation process may be performed. For example, ions of a non-metal material may be implanted in the region 311. Further, an annealing process is performed. Then at step 323, a layer of a ferromagnetic material, as a free layer for the MTJ, may be deposited on the metal layer. At step 324, a layer of an electrically insulating material, as a barrier layer, may be deposited. Then at step 325, another layer of a ferromagnetic material, as a reference layer, may be deposited. Next, an etch-out step, step 326, is performed. Parts of the stacked layers may be etched out selectively to form the MTJs 301 and 302. A photoresist layer and a mask may be used in a dry etching process. The MTJ 301 may be arranged above and adjacent to the region 310 of the metal layer. The MTJ 302 may be arranged above and adjacent to the region 311. As such, the free layers 305 and 308 may be in contact with the regions 310 and 311, respectively. After step 326, contact metal such as copper may be deposited to form the terminals 1, 2, and 3.

In a batch fabrication process, another etch-out step may be performed after step 325 or step 326. This etch-out step may be used to cut the metal layer to form an array of the structures 300. In the array of the structures 300, each structure 300 may comprise a pair of the contact regions 310 and 311 and a pair of the MTJs 301 and 302. Accordingly in the array, each contact region 310 may be adjacent to a corresponding contact region 311 and each MTJ 301 may be adjacent to a corresponding MTJ 302.

Figure 4A:
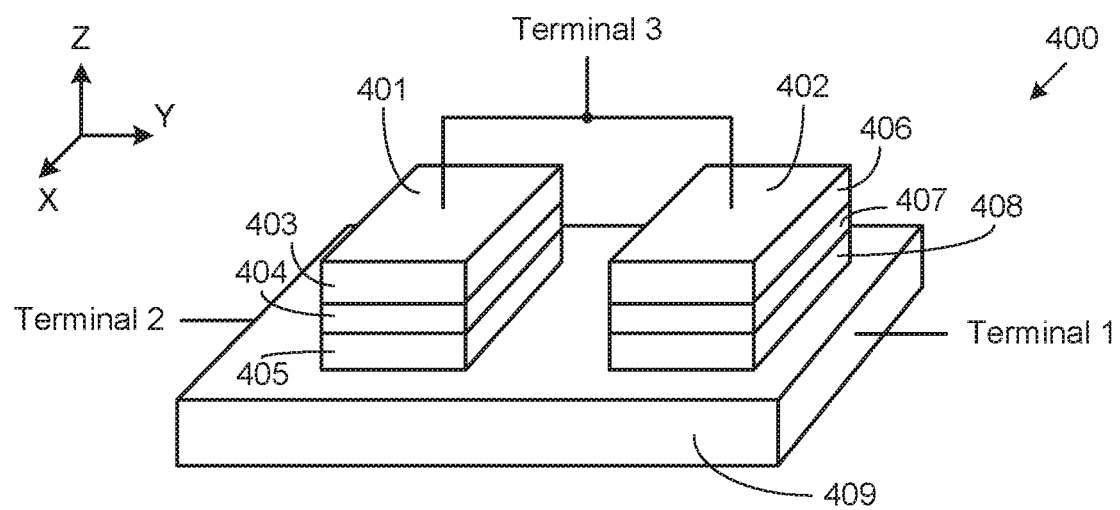
FIGS. 4A and 4B illustrate schematic structural diagrams of another multilevel SOT-MRAM structure according to another embodiment of the present disclosure.
Figure 4B:
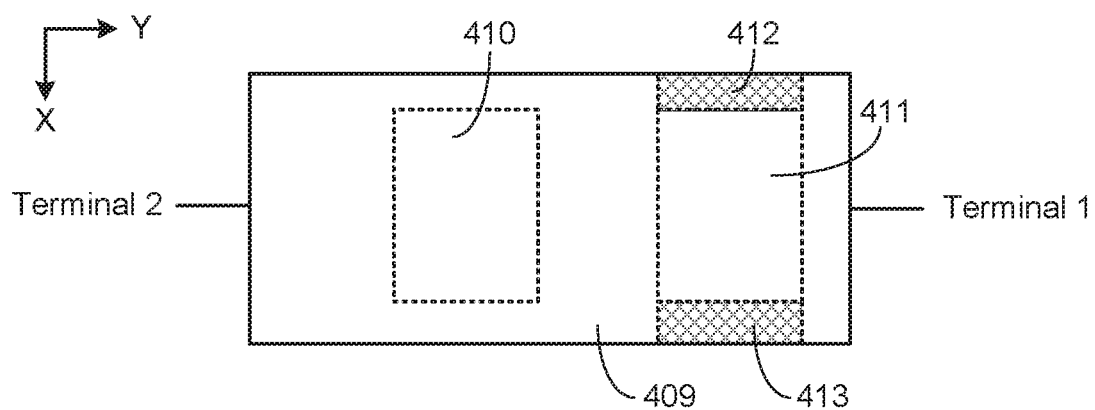

FIGS. 4A and 4B show schematic structural diagrams of another exemplary multilevel SOT-MRAM structure 400, consistent with embodiments of the present disclosure. FIG. 4A is a perspective view of the structure 400 and FIG. 4B is a graphical illustration in a top view of the structure 400. The structure 400 is similar to the structure 300 shown in FIGS. 3A and 3B but has a different configuration of ion implantation region. The structure 400 may comprise MTJs 401 and 402 electrically connected in parallel. The MTJ 401 may include a reference layer 403, a barrier layer 404, and a free layer 405. The MTJ 402 may include a reference layer 406, a barrier layer 407, and a free layer 408. The MTJs 401 and 402 may be disposed on a metal layer 409 and spaced apart by a predetermined distance. At the MTJ 401, the barrier layer 404 may be sandwiched by the reference layer 403 and the free layer 405. The free layer 405 may be in contact with the metal layer 409. At the MTJ 402, the barrier layer 407 may be sandwiched by the reference layer 406 and the free layer 408. The free layer 408 may be in contact with the metal layer 409. Terminal 1 and 2 may be electrically coupled with two ends of the metal layer 409, respectively. A terminal 3 and the reference layers 403 and 406 may be electrically coupled.

The reference layers 403 and 406 may comprise a ferromagnetic material. Magnetization direction of the reference layers 403 and 406 may be fixed during the operation of the structure 400. The free layers 405 and 408 may also comprise a ferromagnetic material. Magnetization direction of the free layer 405 and 408 may be switchable between two directions under certain external influence. The change of magnetization direction of the free layers 405 and 408 may be used to store multilevel information. The barrier layers 404 and 407 may comprise an electrically insulating material. The metal layer 409 may be made of a non-magnetic heavy metal.

Like the structure 300 illustrated in FIGS. 3A and 3B, assuming that the MTJs 401 and 402 comprise a same structure and same materials. Electrical resistance of the MTJs 401 and 402 may be used to read information stored at the structure 400.

The magnetization states of the free layer 405 and 408 may be switched using an electric current applied to the metal layer 409 via the terminals 1 and 2. The electric current may function as the write current of the structure 400. When the write current flows from the terminal 1 to the terminal 2, magnetization states of the free layers 405 and 408 may be switched to the positive direction of the X-axis. When the write current flows from the terminal 2 to the terminal 1, magnetization states of the free layers 405 and 408 may be switched to the negative direction of the X axis.

Hence, the write process of the structure 400 may be performed by applying an electric current to the metal layer 409 and the read process may be performed by measuring electrical resistance of the MTJs 401 and 402 which are connected electrically in parallel.

Above description of the device 400 may reflect the operation of a single-level memory device where only data such as "1" or "0" may be stored and read.

FIG. 4B is a graphic illustration of the structure 400 and may represent a top view, with the MTJs 401 and 402 omitted. As mentioned previously, the free layers 405 and 408 are in contact with the metal layer 409. Assuming that the free layers 405 and 408 contact surfaces of contact regions 410 and 411 of the metal layer 409, respectively. Rectangles in dotted lines may illustrate the contact regions 410 and 411, as shown in FIG. 4B. Further, an ion implantation process may be performed in regions 412 and 413, which are adjacent to the two opposite sides of the contact region 411 along the direction of the X-axis. Ions of non-metal materials may be used in the implantation process. An annealing step may follow the implantation.

As such, electrical resistivity of the regions 412 and 413 may increase and become larger than electrical resistivity of the rest regions of the metal layer 409, including the contact regions 410 and 411. As shown in FIG. 4B, a segment of the metal layer 409 is divided into regions 412, 411, and 413, which are arranged along the X axis. As the regions 412, 411, and 413 are electrically coupled in parallel, an electric current applied to the metal layer 409 is split into three sub-currents. Due to the larger electrical resistivity in the regions 412 and 413 than in the region 411, the electric current density in the region 411 is larger than that in the region 410. A larger electric current density may induce a larger spin current density that may be injected into the free layer 405.

As aforementioned, the MTJs 401 and 402 may comprise a same structure and same materials. Hence, the free layers 405 and 408 have a same threshold of electric current density for switching the magnetization orientation. Because the electric current density in the region 411 is larger than that in the region 410 when a write current is injected to the metal layer 409, there may exist three scenarios. When the write current is arranged such that electric current densities in both the regions 410 and 411 are larger than the threshold, magnetization states of the free layers 405 and 408 may be switched together. When the electric current density in the region 411 is larger than the threshold, while the electric current density in the region 410 is below the threshold, magnetization state of only one free layer, the free layers 408, may be switched. When the electric current density in the region 411 is below the threshold, magnetization state of neither of the free layers 405 and 408 may be switched.

Thus, the structure 400 may provide three distinguishable electrical resistance states, which may represent three memory states or three memory levels.

The first electrical resistance state may be written using an electric current that produces an electric current density larger than the threshold in the region 410. As the electric current density in the region 411 is larger than that in the region 410, the electric current density is larger than the threshold in both regions 410 and 411. As such, magnetization states of the free layers 405 and 408 may be switched together. And both the MTJs 401 and 402 may have parallel magnetization states for the reference and free layers. The electrical resistance of the MTJs 401 and 402 is the smallest.

Similarly, the second electrical resistance state may be written using an electric current that produces an electric current density larger than the threshold in both the regions 410 and 411. Both the MTJs 401 and 402 may be switched to the anti-parallel magnetization states for the reference and free layers. The electrical resistance of the MTJs 401 and 402 is the largest.

The third electrical resistance state may be written using two electric currents sequentially. A first electric current may produce an electric current density larger than the threshold in both the regions 410 and 411. A second electric current may produce an electric current density larger than the threshold in the region 411 only. The first electric current may be applied to make parallel or anti-parallel magnetization states for the reference and free layers at both the MTJs 401 and 402. As the second electric current may only switch magnetization state of the free layer 408, it is utilized to make parallel or anti-parallel magnetization states for the reference and free layers at the MTJ 402. In the third electrical resistance state, the MTJs 401 and 402 may be switched to different magnetization states, where one MTJ may have parallel magnetization states and the other MTJ may have anti-parallel magnetization states for the reference and free layers. The electrical resistance of the MTJs 401 and 402 is between the smallest and largest values.

Figure 5A:
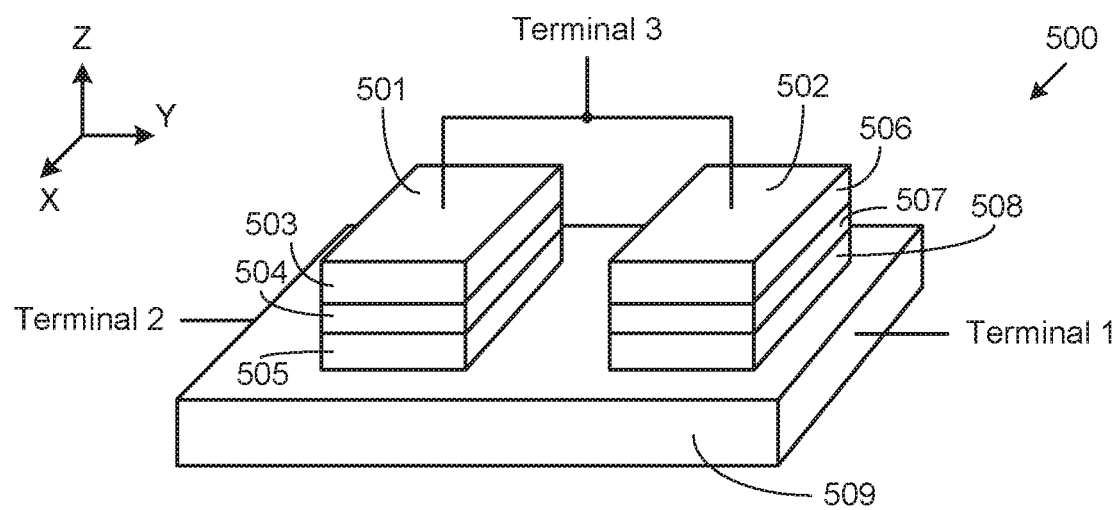
FIGS. 5A and 5B illustrate schematic structural diagrams of another multilevel SOT-MRAM structure according to another embodiment of the present disclosure.
Figure 5B:
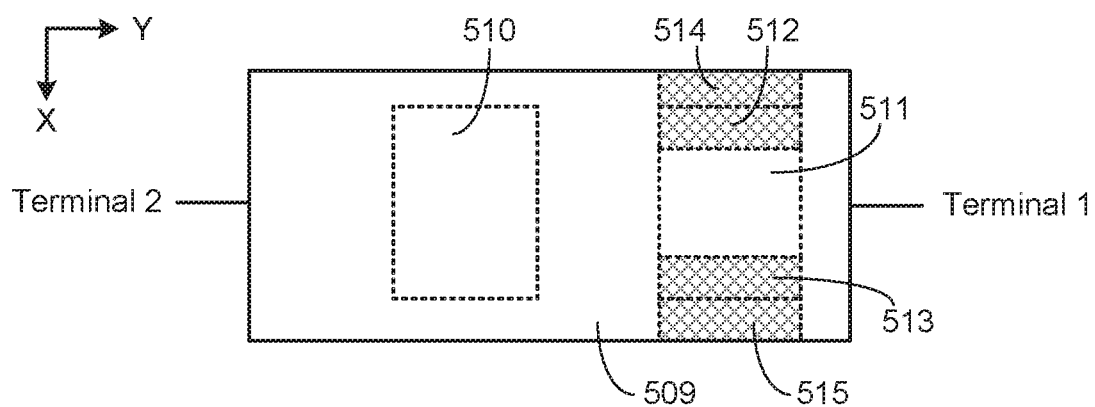

FIGS. 5A and 5B show schematic structural diagrams of another exemplary multilevel SOT-MRAM structure 500, consistent with embodiments of the present disclosure. FIG. 5A is a perspective view of the structure 500 and FIG. 5B is a graphical illustration in a top view of the structure 500. The structure 500 is similar to the structure 300 shown in FIGS. 3A and 3B but may have different configuration of the ion implantation region. The structure 500 may comprise MTJs 501 and 502 electrically connected in parallel. The MTJ 501 may include a reference layer 503, a barrier layer 504, and a free layer 505. The MTJ 502 may include a reference layer 506, a barrier layer 507, and a free layer 508. The MTJs 501 and 502 may be disposed on a metal layer 509 and spaced apart by a predetermined distance. At the MTJ 501, the barrier layer 504 may be sandwiched by the reference layer 503 and the free layer 505. The free layer 505 may be in contact with the metal layer 509. At the MTJ 502, the barrier layer 507 may be sandwiched by the reference layer 506 and the free layer 508. The free layer 508 may be in contact with the metal layer 509 as well. Terminals 1 and 2 may be electrically coupled with two ends of the metal layer 509, respectively. A terminal 3 and the reference layers 503 and 506 may be electrically coupled.

The reference layers 503 and 506 may comprise a ferromagnetic material and have a fixed magnetization direction. The free layers 505 and 508 may also comprise a ferromagnetic material. Magnetization directions of the free layer 505 and 508 may be switchable between two directions. The change of magnetization direction of the free layers 505 and 508 may be used to store multilevel information. The barrier layers 504 and 507 may comprise an electrically insulating material. The metal layer 509 may be made of a non-magnetic heavy metal.

Like the structure 300 illustrated in FIGS. 3A and 3B, assuming that the MTJs 501 and 502 comprise a same structure and same materials. Electrical resistance of the MTJs 501 and 502 may be used to read information stored at the structure 500.

The magnetization states of the free layer 505 and 508 may be switched using an electric current applied to the metal layer 509 via the terminals 1 and 2. The electric current may function as the write current of the structure 500. When an electric current flows from the terminal 1 to the terminal 2, magnetization states of the free layers 505 and 508 may be switched to the positive direction of the X-axis. When the current flows from the terminal 2 to the terminal 1, magnetization states of the free layers 505 and 508 may be switched to the negative direction of the X axis.

Hence, the write process of the structure 500 may be performed by applying an electric current to the metal layer 509 and the read process may be performed by measuring electrical resistance of the MTJs 501 and 502 which are connected electrically in parallel.

Above description of the structure 500 reflects the operation of a single-level memory device where only data such as "1" or "0" may be stored and read.

FIG. 5B is a graphic illustration of the structure 500. The figure may represent a top view, with the MTJs 501 and 502 omitted. As mentioned, the free layers 505 and 508 may be in contact with the metal layer 509 respectively. The MTJ 501 or the free layer 505 may be adjacent to a region 510. The MTJ 502 or the free layer 508 may be adjacent to a contact region including regions 511, 512, and 513. The regions 512 and 513 are separated by the region 511, i.e., being spaced apart by a predetermined distance along the X-axis. Regions 514 and 515 may be adjacent to the regions 512 and 513, respectively. The regions 510-515 are depicted in dotted lines, as shown in FIG. 5B. Further, ion implantation may be applied to the regions 512, 513, 514, and 515. Ions of non-metal materials may be used in the implantation process. An annealing step may follow the implantation.

As such, electrical resistivity of the regions 512-515 may increase and become larger than electrical resistivity of the rest of the metal layer 509, including the regions 510 and 511. As shown in FIG. 5B, a segment of the metal layer 509 may be divided into the regions 511-515, which are arranged along the X axis. As the regions 511-515 are electrically coupled in parallel and the regions 512 and 514, 513 and 515 may represent two combined regions, an electric current applied to the metal layer 509 may be split into three sub-currents. One sub-current passes through the region 511, while the other two pass through the combined regions, respectively. Due to the larger electrical resistivity in the combined regions, the electric current density in the region 511 is larger than that in the regions 512-515. The electric current density in the region 511 is also larger than that in the region 510. In addition, the electric current density in the region 510 is larger than that in the regions 512-515.

As the free layers 505 and 508 may have a same threshold of electric current density for switching the magnetization orientation, four scenarios may exist. First, when the electric current density in the regions 512 and 513 is larger than the threshold, electric current densities in the regions 510 and 511 are larger than the threshold, too. Then, magnetization states of all parts of the free layers 505 and 508 may be switched together. Second, when the electric current density is below the threshold in the regions 512 and 513 and above the threshold in the regions 510 and 511, magnetization state of the free layer 505 may be switched fully, while magnetization state of the free layer 508 may only be switched partially. The partially switched portion of the free layer 508 is above and adjacent to the region 511. Third, when the electric current density is above the threshold only in the region 511, magnetization state of the free layer 505 may not be switched, while magnetization state of the free layer 508 may be switched partially. The partially switched portion of the free layer 508 is above and adjacent to the region 511. Fourth, when the electric current density is below the threshold in the region 511, magnetization state of neither of the free layers 505 and 508 may be switched.

Hence, the structure 500 may provide eight distinguishable electrical resistance states, which may represent eight memory states or eight memory levels.

The first and second resistance states may be written using a write current that produces an electric current density larger than the threshold in the regions 512 and 513, which means electric current densities are larger than the threshold in the regions 510-513. As such, magnetization states of all parts of the free layers 505 and 508 may be switched together. The first electrical resistance state has the lowest electrical resistance value, corresponding to the MTJs 501 and 502 with parallel magnetization states for the reference and free layers. The second electrical resistance state has the largest electrical resistance value, corresponding to the MTJs 501 and 502 with anti-parallel magnetization states for the reference and free layers.

The third and fourth electrical resistance states may be written using two electric currents sequentially. The first electric current produces an electric current density larger than the threshold in the regions 510-513. The second electric current produces an electric current density larger than the threshold in the region 510 but below the threshold in the regions 512 and 513, which means the electric current density is larger than the threshold in the region 511 as well. When the first electric current is applied, magnetization states of the free layers 505 and 508 may be switched together. For the third resistance state, the first current may be applied to create parallel magnetization states for the reference and free layers at the MTJs 501 and 502. Then, the second electric current is applied to create anti-magnetization states for the reference and free layers at the MTJ 501 fully and for the reference and free layers at the MTJ 502 partially. As such, all parts of the MTJ 501 may have the anti-parallel magnetization states, one part of the MTJ 502 that matches the region 511 may have the anti-parallel magnetization states, and the rest parts of the MTJ 502 that match the regions 512 and 513 may have the parallel magnetization states, which represents the third electrical resistance state. Similarly, the first and second electric currents may be arranged to make that all parts of the MTJ 501 and one part of the MTJ 502 that matches the region 511 have the parallel magnetization states, and the rest two parts of the MTJ 502 that match the regions 512 and 513 may have the anti-parallel magnetization states, which represents the fourth electrical resistance state. The three parts of the MTJ 502 that match the regions 511, 512, and 513 are electrically coupled in parallel. Hence the electrical resistance of the MTJ 502 corresponds to three electrical resistors that are electrically connected in parallel.

The fifth to eighth electrical resistance states may be written using three electric currents sequentially. The first electric current may produce an electric current density larger than the threshold in the regions 510-513. The second electric current may produce an electric current density larger than the threshold in the regions 510 and 511 but below the threshold in the regions 512 and 513. The third electric current may produce an electric current density larger than the threshold in the region 511 but below the threshold in the regions 510, 512, and 513. The first, second, and third electric currents may be used to write information sequentially. When magnetization state of a free layer or a portion of a free layer is switched multiple times, it is the last time that counts.

The fifth to eighth electrical resistance states may be defined as follows. Resistance values of the structure 500 corresponding to the fifth to eighth electrical resistance states may depend on the design of the regions 510-513 and the design of the MTJs 501 and 502.

When all parts of the MTJ 501 have the parallel magnetization states and all parts of the MTJ 502 have the anti-parallel magnetization states, it represents the fifth electrical resistance state.

When all parts of the MTJ 501 have the anti-parallel magnetization states and all parts of the MTJ 502 have the parallel magnetization states, it represents the sixth electrical state.

When all parts of the MTJ 501 and two parts of the MTJ 502 that match the regions 512 and 513 have the parallel magnetization states and the rest part of the MTJ 502 that matches the region 511 has anti-parallel magnetization states, it represents the seventh electrical state.

When all parts of the MTJ 501 and two parts of the MTJ 502 that match the regions 512 and 513 have the anti-parallel magnetization states, and the rest part of the MTJ 502 that matches the region 511 has the parallel magnetization states, it represents the eighth electrical resistance state.

Figure 6A:
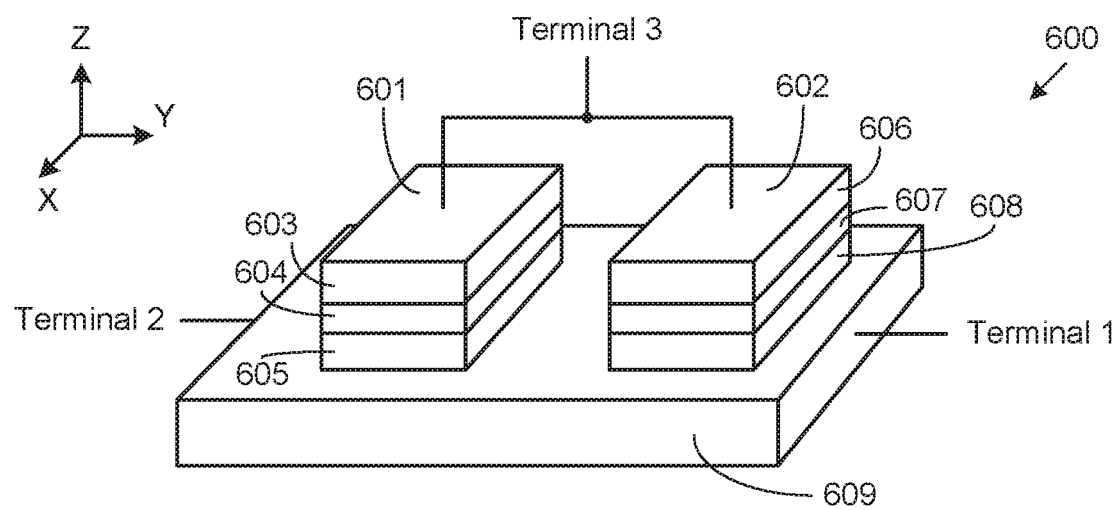
FIGS. 6A and 6B illustrate schematic structural diagrams of another multilevel SOT-MRAM structure according to another embodiment of the present disclosure.
Figure 6B:
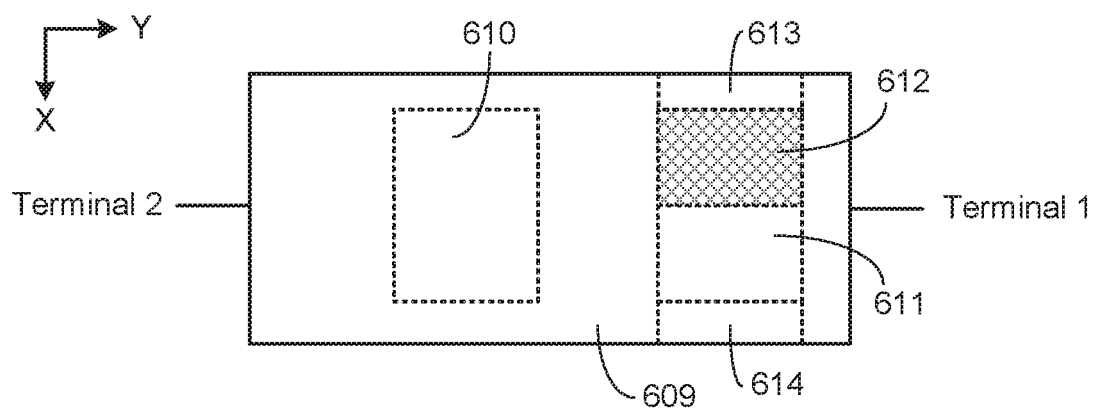

FIGS. 6A and 6B show schematic structural diagrams of another exemplary multilevel SOT-MRAM structure 600, consistent with embodiments of the present disclosure. FIG. 6A is a perspective view of the structure 600 and FIG. 6B is a graphical illustration in a top view of the structure 600. The structure 600 is similar to the structures 300, 400, and 500 shown above yet has a different configuration of the ion implantation region. The structure 600 may comprise MTJs 601 and 602 electrically connected in parallel. The MTJ 601 may include a reference layer 603, a barrier layer 604, and a free layer 605. The MTJ 602 may include a reference layer 606, a barrier layer 607, and a free layer 608. The MTJs 601 and 602 may be disposed on a metal layer 609 and spaced apart by a predetermined distance. At MTJ 601, the barrier layer 604 may be sandwiched by the reference layer 603 and the free layer 605. The free layer 605 may be in contact with the metal layer 609. At MTJ 602, the barrier layer 607 may be sandwiched by the reference layer 606 and the free layer 608. The free layer 608 may be in contact with the metal layer 609 as well. Terminal 1 and 2 may be electrically coupled with two ends of the metal layer 609, respectively. A terminal 3 and the reference layers 603 and 606 may be electrically coupled.

The reference layers 603 and 606 may comprise a ferromagnetic material and have a fixed magnetization direction. The free layers 605 and 608 may also comprise a ferromagnetic material. Magnetization directions of the free layer 605 and 608 may be switchable between two directions. The change of magnetization direction of the free layers 605 and 608 may be used to store multilevel information. The barrier layers 604 and 607 may comprise an electrically insulating material. The metal layer 609 may be made of a non-magnetic heavy metal.

Like the structure 300 illustrated in FIGS. 3A and 3B, assuming that the MTJs 601 and 602 comprise a same structure and same materials. Electrical resistance of the MTJs 601 and 602 may be used to read information stored at the structure 600.

The magnetization states of the free layer 605 and 608 may be switched using an electric current applied to the metal layer 609 via the terminals 1 and 2. The electric current may function as the write current of the structure 600. When an electric current flows from the terminal 1 to the terminal 2, magnetization states of the free layers 605 and 608 may be switched to the positive direction of the X-axis. When the current flows from the terminal 2 to the terminal 1, magnetization states of the free layers 605 and 608 may be switched to the negative direction of the X axis.

Hence, the write process of the structure 600 may be performed by applying an electric current to the metal layer 609 and the read process may be performed by measuring electrical resistance of the MTJs 601 and 602 which are connected electrically in parallel.

Above description of the structure 600 reflects the operation of a single-level memory device where only data such as "1" or "0" may be stored and read.

FIG. 6B is a graphic illustration of the structure 600. The figure represents a top view, with the MTJs 601 and 602 omitted. The free layers 605 and 608 may contact surfaces of two contact regions of the metal layer 609, respectively. One contact region may include a region 610, while the other contact region may include regions 611 and 612. Regions 613 and 614 may be adjacent to the regions 612 and 611, respectively. Regions 610-614 are depicted in dotted lines, as shown in FIG. 6B. Further, ion implantation is applied to the region 612. Ions of non-metal materials may be used in the implantation process. An annealing step may follow the implantation.

Accordingly, resistivity of the region 612 may increase and become larger than resistivity of the rest of the metal layer 609, including the regions 610, 611, 613, and 614. As shown in FIG. 6B, a segment of the metal layer 609 is divided into regions 611-614, which are arranged along the X axis. The regions 611-614 are electrically coupled in parallel. The regions 611 and 614 may represent combined regions. Thus, an electric current applied to the metal layer 609 may be split into three sub-currents. One sub-current passes through the region 612, while the other two pass through the region 613 and the combined regions. Due to the larger resistivity in the region 612, the electric current density in the regions 610 and 611 is larger than that in the region 612, and the electric current density in the region 611 is larger than that in the region 610.

Like embodiments mentioned above, the free layers 605 and 608 may have a same threshold of electric current density for switching the magnetization orientation. Because there are three electric current densities in the regions 610, 611, and 612, when a write current is injected to the metal layer 609, four scenarios may exist. First, when the electric current density is larger than the threshold in the regions 610, 611, and 612, the magnetization states of the free layers 605 and 608 may be switched together. Second, when the electric current density is larger than the threshold only in the regions 610 and 611, magnetization state of the free layer 605 may be switched fully, while magnetization state of the free layer 608 may be switched partially. The partially switched portion of the free layer 608 corresponds to the region 611. Third, when the electric current density is larger than the threshold only in the region 611, magnetization state of free layers 608 may be switched partially. The partially switched portion of the free layer 608 corresponds to the region 611. Fourth, when the electric current density is below the threshold in the regions 610, 611, and 612, the magnetization state of neither of the free layers 605 and 608 may be switched.

Hence, the structure 600 may provide eight distinguishable electrical resistance states as illustrated below, which may represent eight memory states or eight memory levels.

The first and second resistance states may be written using a write current that produces an electric current density larger than the threshold in the regions 610, 611, and 612. As such, magnetization states of all parts of the free layers 605 and 608 may be switched together. The first electrical resistance state has the lowest electrical resistance value, corresponding to the MTJs 601 and 602 with parallel magnetization states for the reference and free layers. The second electrical resistance state has the largest electrical resistance value, corresponding to the MTJs 601 and 602 with anti-parallel magnetization states for the reference and free layers.

The third and fourth electrical resistance states may be written using two electric currents sequentially. The first electric current produces an electric current density larger than the threshold in the regions 610, 611, and 612. The second electric current produces an electric current density larger than the threshold in the regions 610 and 611 but below the threshold in the region 612. When the first electric current is applied, magnetization states of all parts of the free layers 605 and 608 may be switched together. For the third resistance state, the first current may be applied to create parallel magnetization states for the reference and free layers at the MTJs 601 and 602. Then, the second electric current is applied to create anti-magnetization states for the reference and free layers at the MTJ 601 fully and for the reference and free layers at the MTJ 602 partially. As such, all parts of the MTJ 601 may have the anti-parallel magnetization states, one part of the MTJ 602 that matches the region 611 may have the anti-parallel magnetization states, and the other part of the MTJ 602 that matches the region 612 may have the parallel magnetization states, which represents the third electrical resistance state. Similarly, the first and second electric currents may be arranged to make that all parts of the MTJ 601 and one part of the MTJ 602 that matches the region 611 have the parallel magnetization states, and the other part of the MTJ 602 that matches the region 612 have the anti-parallel magnetization states, which represents the fourth electrical resistance state. The two parts of the MTJ 602 that match the regions 611 and 612 are electrically coupled in parallel. Hence the electrical resistance of the MTJ 602 corresponds to two electrical resistors that are electrically connected in parallel.

The fifth to eighth electrical resistance states may be written using three electric currents sequentially. The first electric current may produce an electric current density larger than the threshold in the regions 610-612. The second electric current may produce an electric current density larger than the threshold in the regions 610 and 611 but below the threshold in the region 612. The third electric current may produce an electric current density larger than the threshold in the region 611 but below the threshold in the regions 610 and 612. The first, second, and third electric currents may be used to write information sequentially.

The fifth to eighth electrical resistance states may be defined as follows. Resistance values of the structure 600 corresponding to the fifth to eighth electrical resistance states may depend on the design of the regions 610-612 and the design of the MTJs 601 and 602.

When all parts of the MTJ 601 have the parallel magnetization states and all parts of the MTJ 602 have the anti-parallel magnetization states, it represents the fifth electrical resistance state.

When all parts of the MTJ 601 have the anti-parallel magnetization states and all parts of the MTJ 602 have the parallel magnetization states, it represents the sixth electrical state.

When all parts of the MTJ 601 and a part of the MTJ 602 that match the region 612 has the parallel magnetization states and the other part of the MTJ 602 that matches the region 611 has anti-parallel magnetization states, it represents the seventh electrical state.

When all parts of the MTJ 601 and a part of the MTJ 602 that match the region 612 have the anti-parallel magnetization states, and the other part of the MTJ 602 that matches the region 611 has the parallel magnetization states, it represents the eighth electrical resistance state.

Figure 7A:
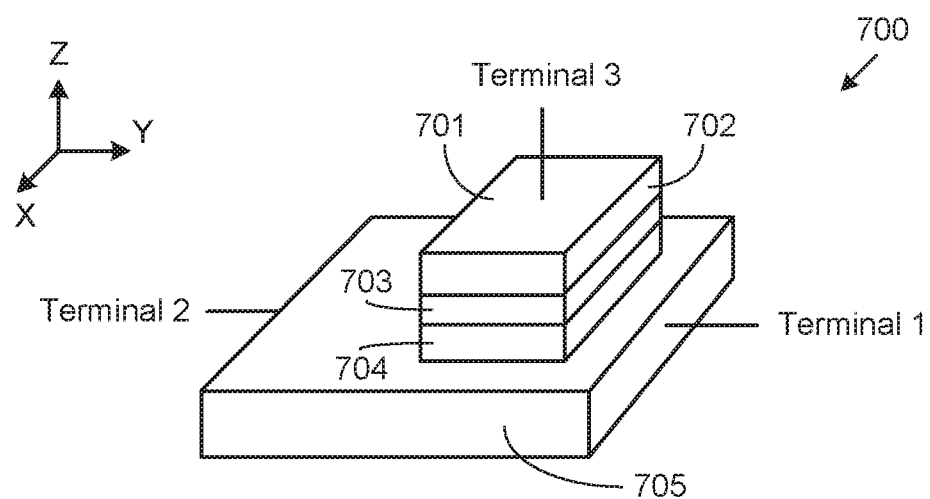
FIGS. 7A and 7B illustrate schematic structural diagrams of another multilevel SOT-MRAM structure according to another embodiment of the present disclosure.
Figure 7B:
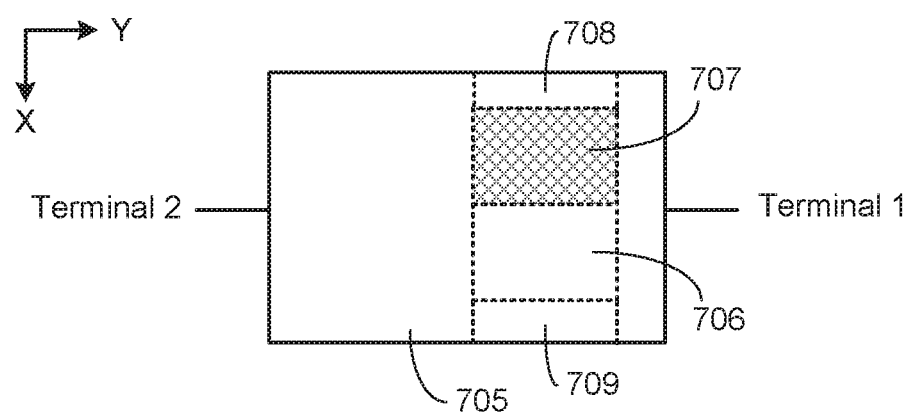

FIGS. 7A and 7B show schematic structural diagrams of another exemplary multilevel SOT-MRAM structure 700, consistent with embodiments of the present disclosure. FIG. 7A is a perspective view of the structure 700 and FIG. 7B is a graphical illustration in a top view of the structure 700. The structure 700 has only one MTJ, a MTJ 701, which is similar to part of the structure 600 shown in FIGS. 6A and 6B. The MTJ 701 may include a reference layer 702, a barrier layer 703, and a free layer 704. The MTJ 701 may be disposed on a metal layer 705. At the MTJ 701, the barrier layer 703 is sandwiched by the reference layer 702 and the free layer 704. The free layer 704 may be in contact with the metal layer 705 and sandwiched by the barrier layer 703 and the metal layer 705. Terminal 1 and 2 may be electrically coupled with two ends of the metal layer 705, respectively. A terminal 3 and the reference layer 702 may be electrically coupled.

The reference layer 702 may comprise a ferromagnetic material and have a fixed magnetization direction. The free layer 704 may also comprise a ferromagnetic material. Magnetization direction of the free layer 704 may be switchable between two directions. The change of magnetization direction of the free layer 704 may be used to store multilevel information. The barrier layer 703 may comprise an electrically insulating material. The metal layer 705 may be made of a non-magnetic heavy metal. Electrical resistance of the MTJ 701 may be used to read information stored at the structure 700.

The magnetization state of the free layer 704 may be switched using an electric current applied to the metal layer 705 via the terminals 1 and 2. The electric current may function as the write current of the structure 700. When an electric current flows from the terminal 1 to the terminal 2, magnetization state of the free layer 704 may be switched to the positive direction of the X-axis. When the electric current flows from the terminal 2 to the terminal 1, magnetization state of the free layer 704 may be switched to the negative direction of the X axis.

Hence, the write process of the structure 700 may be performed by applying an electric current to the metal layer 705 and the read process may be performed by measuring electrical resistance of the MTJ 701.

FIG. 7B is a graphic illustration of the structure 700. The figure may represent a top view, with the MTJ 701 omitted. Assuming that the free layer 704 contacts a surface of a contact region of the metal layer 705. The contact region may include regions 706 and 707, which are adjacent to regions 709 and 708, respectively. The regions 706-709 are depicted in dotted lines, as shown in FIG. 7B. Further, ion implantation is applied to the region 707. Ions of non-metal materials may be used in the implantation process. An annealing step may follow the implantation.

As such, electrical resistivity of the region 707 may increase and become larger than that of the rest of the metal layer 705, including the regions 706, 708, and 709. As shown in FIG. 7B, a segment of the metal layer 705 may be divided into regions 706-709, which are arranged along the X axis. The regions 706-709 are electrically coupled in parallel. The regions 706 and 709 may represent combined regions. Thus, an electric current applied to the metal layer 705 may be split into three sub-currents. One sub-current passes through the region 707, while the other two pass through the region 708 and the combined regions. Due to the larger resistivity in the region 707, the electric current density in the region 706 is larger than that in the region 707. Regions 706 and 707 correspond to two portions of the free layer 704.

Because there are two electric current densities when a write current is injected to the metal layer 705, three scenarios may exist. First, when the electric current density in both the regions 706 and 707 is larger than the threshold of electric current density for switching the magnetization orientation, magnetization state of the whole free layer 704 may be switched. Second, when the electric current density is larger than the threshold in the region 706 but below the threshold in the region 707, magnetization state of the free layer 704 may be switched partially. The partially switched portion of the free layer 704 may correspond to the region 706. Third, when the electric current density is below the threshold in the regions 706 and 707, magnetization state of the free layer 704 may not be switched.

Hence, the structure 700 may provide four distinguishable electrical resistance states as illustrated below, which may represent four memory states or four memory levels.

The first and second resistance states may be written using a write current that produces an electric current density larger than the threshold in the regions 706 and 707. As such, magnetization states of all parts of the free layer 704 may be switched. The first electrical resistance state has the lowest electrical resistance value, corresponding to the MTJ 701 with parallel magnetization states for the reference and free layers. The second electrical resistance state has the largest electrical resistance value, corresponding to the MTJ 701 with anti-parallel magnetization states for the reference and free layers.

The third and fourth electrical resistance states may be written using two electric currents sequentially. The first electric current produces an electric current density larger than the threshold in the regions 706 and 707. The second electric current produces an electric current density larger than the threshold in the region 706 but below the threshold in the region 707. When the first electric current is applied, magnetization states of all parts of the free layer 704 may be switched together. For the third resistance state, the first current may be applied to create parallel magnetization states for the reference and free layers at the MTJ 701. Then, the second electric current is applied to create anti-magnetization states for the reference and free layers at the MTJ 701 partially. As such, one part of the MTJ 701 that matches the region 706 may have the anti-parallel magnetization states, and the other part of the MTJ 701 that matches the region 707 may have the parallel magnetization states, which represents the third electrical resistance state. Similarly, the first and second electric currents may be arranged to make that one part of the MTJ 701 that matches the region 706 has the parallel magnetization states, and the other part of the MTJ 701 that matches the region 707 has the anti-parallel magnetization states, which represents the fourth electrical resistance state. The two parts of the MTJ 701 that match the regions 706 and 707 are electrically coupled in parallel. Hence the electrical resistance of the MTJ 701 corresponds to two electrical resistors that are electrically connected in parallel.

Figure 8:
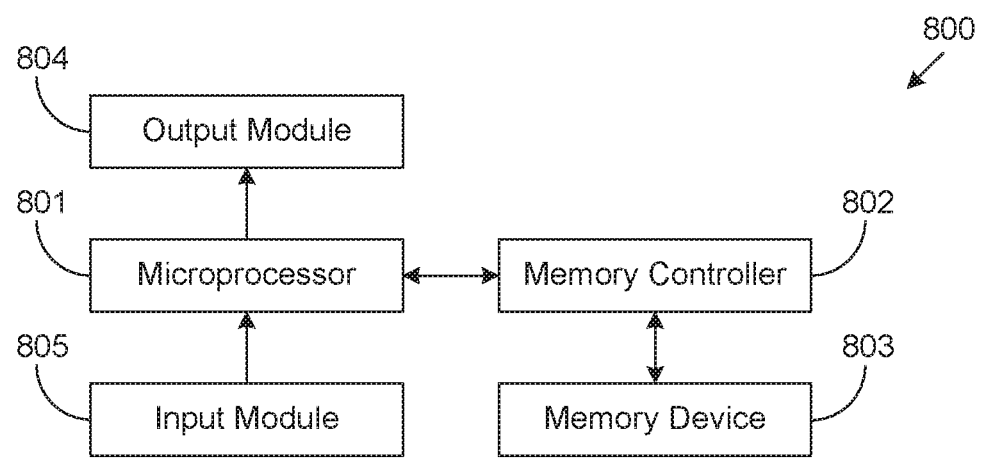
FIG. 8 illustrates a schematic block diagram of an electronic device according to another embodiment of the present disclosure.

FIG. 8 is a schematic block diagram illustrating an electronic device 800, consistent with embodiments of the present disclosure. The device 800 may include a computing device such as a desktop or portable computer, a server, a smartphone, a smart watch, and the like. The device 800 may also include a networking device (such as a switch or a router), a recorder of digital images, audio and/or video, a vehicle, an appliance, and a toy, etc. As shown, the device 800 may comprise a microprocessor 801, a memory controller 802, a memory device 803, an output module 804, and an input module 805.

The microprocessor 801 (e.g., central processing unit (CPU)) may control the overall operation of the electronic device 800, including the operation of the memory controller 802 and the output module 804. The output module 804 may include a display and/or a speaker. The input module 805 may include a keyboard, a key pad, a computer mouse, or a touch screen. In some embodiments, the output and input modules 804 and 805 may be combined using a touch screen. The microprocessor 801 may displays information stored at the memory device 803 through the output module 804 (e.g., a display) according to an input signal generated by the input module 805 (e.g., a keyboard).

The memory device 803 may comprise one or more memory regions. In some embodiments, each memory region may comprise one or more arrays of the magnetic memory structures described above. In some other embodiments, each memory region may comprise one or more arrays of the magnetic memory structures described above and one or more arrays of other types of memories. The memory controller 802 controls the operation of the memory device 803. The operations performed by the memory device 803 include erase, write, and read. In some embodiments, the memory device 803 may include a control circuitry. The memory controller 802 may control the memory device 803 via the control circuitry. In some other embodiments, the memory device 803 may not include any control circuitry. Then, the memory controller 802 may control the memory device 803 directly.

Although the principles and implementations of the present disclosure are described by using specific embodiments in the specification, the foregoing descriptions of the embodiments are only intended to help understand the method and core idea of the method of the present disclosure. In addition, features of aforementioned different embodiments may be combined to form additional embodiments. Meanwhile, a person of ordinary skill in the art may make modifications to the specific implementations and application range according to the idea of the present disclosure. Hence, the content of the specification should not be construed as a limitation to the present disclosure.

What is claimed is:

1. A memory device, comprising:
    a control circuitry controlling the memory device; and
    at least one array of memory structures, each memory structure comprising:
        a metal layer including a first region and a second region, wherein electrical resistivity of at least a first part of the first region is different from electrical resistivity of the second region; and
        a first magnetic tunnel junction (MTJ) disposed on the metal layer;
    the first magnetic tunnel junction (MTJ) comprising:
        a first free layer adjacent to the metal layer, the first free layer being in contact with the first region of the metal layer, a direction of magnetization of the first free layer being switchable between a first direction and a second direction under an influence of an electric current flowing along the metal layer;
        a first barrier layer adjacent to the free layer and comprising an electrically insulating material, the first free layer being disposed between the metal layer and the first barrier layer; and
        a first reference layer adjacent to the first barrier layer, a direction of magnetization of the first reference layer remaining along the first direction or the second direction, the first barrier layer being disposed between the first free layer and the first reference layer.

2. The device according to claim 1, wherein each memory structure further comprising:
    a second magnetic tunnel junction (MTJ) disposed on the metal layer;
    the second magnetic tunnel junction (MTJ) comprising:
        a second free layer adjacent to the metal layer, the second free layer being in contact with the second region of the metal layer, a direction of magnetization of the second free layer being switchable between the first direction and the second direction under the influence of the electric current flowing along the metal layer;
        a second barrier layer adjacent to the second free layer and comprising an electrically insulating material, the second free layer being disposed between the metal layer and the second barrier layer; and
        a second reference layer adjacent to the second barrier layer, a direction of magnetization of the second reference layer remaining along the first direction or the second direction, the second barrier layer being disposed between the second free layer and the second reference layer.

3. The device according to claim 2, wherein electrical resistivity of the first part and a second part of the first region are different from electrical resistivity of the second region, the first part and the second part of the first region are spaced apart by a predetermined distance along the first or second direction, electrical resistivity of the first part and the second part of the first region are same.

4. The device according to claim 2, wherein the metal layer further comprising:
    a third region and a fourth region adjacent to two opposite sides of the first region along the first direction or the second direction, wherein electrical resistivity of the first and second regions are same, electrical resistivity of the third and fourth regions are same, electrical resistivity of the first and third regions are different.

5. The device according to claim 2, wherein the first reference layer and the second reference layer are coupled electrically.

6. The device according to claim 2, wherein electrical resistivity of each part of the first region is different from electrical resistivity of the second region.

7. The device according to claim 2, wherein the first magnetic tunnel junction (MTJ) and the second magnetic tunnel junction (MTJ) have a same configuration.

8. The device according to claim 1, wherein the metal layer and the first barrier layer are non-magnetic, the first free layer includes a first ferromagnetic layer, and the first reference layer includes a second ferromagnetic layer.

9. The device according to claim 1, wherein the first part of the first region is processed by an ion implantation process.

10. A method for fabricating an array of memory structures, comprising:
depositing a metal layer on a substrate, the metal layer comprising a plurality of first contact regions and a plurality of second contact regions, each first contact region adjacent to one of the plurality of second contact regions;
performing an ion implantation process in the plurality of first contact regions, at least a part of each first contact region is processed by the ion implantation process;
depositing a free layer, the free layer comprising a first magnetic material;
depositing a barrier layer, the barrier layer comprising an electrically insulating material;
depositing a reference layer, the reference layer comprising a second magnetic material;
forming a plurality of first magnetic tunnel junctions (MTJs) and a plurality of second magnetic tunnel junctions (MTJs) on the metal layer, each first magnetic tunnel junction (MTJ) adjacent to one of the plurality of first contact regions, each second magnetic tunnel junction (MTJ) adjacent to one of the plurality of second contact regions; and
forming the array of memory structures, each memory structure comprising one of the plurality of first magnetic tunnel junctions (MTJs) and one of the plurality of second magnetic tunnel junctions (MTJs).

11. The method according to claim 10, wherein electrical resistivity of the at least a part of each first contact region is different from electrical resistivity of the plurality of second contact regions.

12. The method according to claim 10, wherein all parts of each first contact region are processed by the ion implantation process.

13. A memory device, comprising:
a metal layer;
a first free layer adjacent to the metal layer, the first free layer being in contact with the metal layer, a direction of magnetization of the first free layer being switchable between a first direction and a second direction under an influence of an electric current flowing along the metal layer;
a first barrier layer adjacent to the first free layer and comprising an electrically insulating material, the first free layer being disposed between the metal layer and the first barrier layer; and
a first reference layer adjacent to the first barrier layer, a direction of magnetization of the first reference layer remaining along the first direction or the second direction, the first barrier layer being disposed between the first free layer and the first reference layer,
wherein the metal layer includes a first region and a second region, electrical resistivity of at least a first part of the first region is different from electrical resistivity of the second region, and the first free layer is in contact with the first region.

14. The device according to claim 13, further comprising:
a second free layer adjacent to the metal layer, the second free layer being in contact with the metal layer, a direction of magnetization of the second free layer being switchable between the first direction and the second direction under the influence of the electric current flowing along the metal layer;
a second barrier layer adjacent to the second free layer and comprising an electrically insulating material, the second free layer being disposed between the metal layer and the second barrier layer; and
a second reference layer adjacent to the second barrier layer, a direction of magnetization of the second reference layer remaining along the first direction or the second direction, the second barrier layer being disposed between the second free layer and the second reference layer.

15. The device according to claim 14, wherein the first reference layer and the second reference layer are coupled electrically.

16. The device according to claim 13, wherein electrical resistivity of each part of the first region is different from electrical resistivity of the second region.

17. The device according to claim 13, wherein the first metal layer and the first barrier layer are non-magnetic, the first free layer includes a first ferromagnetic layer, and the first reference layer includes a second ferromagnetic layer.

18. The device according to claim 13, wherein electrical resistivity of the first part and a second part of the first region are different from electrical resistivity of the second region, the first part and the second part of the first region are spaced apart by a predetermined distance along the first or second direction, and electrical resistivity of the first part and the second part of the first region are same.

19. The device according to claim 13, wherein the first part of the first region is processed by an ion implantation process.

* * * * *